(12) United States Patent
An

(10) Patent No.: US 12,247,147 B2
(45) Date of Patent: Mar. 11, 2025

(54) THERMOSETTING ADHESIVE FILM AND COVERLAY FILM COMPRISING SAME

(71) Applicant: Hanwha e-ssential Corporation, Pyeongtaek-si (KR)

(72) Inventor: Jin Man An, Sejong (KR)

(73) Assignee: HANWHA E-SSENTIAL CORPORATION, Pyeongtaek-si (KR)

( * ) Notice: Subject to any disclaimer, the term of this patent is extended or adjusted under 35 U.S.C. 154(b) by 136 days.

(21) Appl. No.: 18/006,858

(22) PCT Filed: Jan. 25, 2022

(86) PCT No.: PCT/KR2022/001291
§ 371 (c)(1),
(2) Date: Jan. 25, 2023

(87) PCT Pub. No.: WO2022/164171
PCT Pub. Date: Aug. 4, 2022

(65) Prior Publication Data
US 2023/0265316 A1 Aug. 24, 2023

(30) Foreign Application Priority Data

Jan. 26, 2021 (KR) .................. 10-2021-0010952
Jan. 26, 2021 (KR) .................. 10-2021-0180810

(51) Int. Cl.
*C09J 7/35* (2018.01)
*C09J 11/04* (2006.01)
*C09J 11/06* (2006.01)

(52) U.S. Cl.
CPC .............. *C09J 7/35* (2018.01); *C09J 11/04* (2013.01); *C09J 11/06* (2013.01); *C09J 2301/304* (2020.08); *C09J 2301/312* (2020.08); *C09J 2433/00* (2013.01); *C09J 2463/00* (2013.01)

(58) Field of Classification Search
CPC ..... C09J 7/35; C09J 11/04; C09J 11/06; C09J 2433/00
USPC ........................................................ 156/330
See application file for complete search history.

(56) References Cited

U.S. PATENT DOCUMENTS

2008/0090075 A1* 4/2008 Kondo ................... C09J 133/02
524/100

FOREIGN PATENT DOCUMENTS

| CN | 1670107 A | 9/2005 |
|---|---|---|
| CN | 1865382 A | 11/2006 |
| CN | 104212375 A | 12/2014 |
| CN | 107556740 A | 1/2018 |
| JP | 2011-506669 A | 3/2011 |

(Continued)

OTHER PUBLICATIONS

Office Action in Chinese Patent Application No. 202280005450.2 issued on Feb. 1, 2024.

(Continued)

*Primary Examiner* — James D Sells
(74) *Attorney, Agent, or Firm* — Knobbe, Martens, Olson & Bear, LLP

(57) ABSTRACT

The present invention relates to a thermosetting adhesive film and a coverlay film comprising the same, and more specifically to a thermosetting adhesive film which has excellent ion migration resistance while having a low dielectric permittivity, as well as excellent peel-off strength, and to a coverlay film comprising the thermosetting adhesive film.

13 Claims, 2 Drawing Sheets

(56) References Cited

FOREIGN PATENT DOCUMENTS

| | | |
|---|---|---|
| KR | 10-2008-0030933 A | 4/2008 |
| KR | 10-2008-0030934 A | 4/2008 |
| KR | 10-2011-0128863 A | 11/2011 |
| KR | 10-2015-0088437 A | 8/2015 |
| KR | 10-1577686 B1 | 12/2015 |
| KR | 10-2019-0036190 A | 4/2019 |

OTHER PUBLICATIONS

International Search Report mailed Feb. 9, 2022 in International Application No. PCT/KR2022/001291.

\* cited by examiner

THERMOSETTING ADHESIVE FILM AND COVERLAY FILM COMPRISING SAME

CROSS-REFERENCE TO RELATED APPLICATION

This application claims priority to and the benefit of Korean Patent Application No. 10-2021-0010952, filed on Jan. 26, 2021, and Korean Patent Application No. 10-2021-0180810, filed on Jan. 26, 2021, the disclosures of which are incorporated herein by reference in their entirety.

TECHNICAL FIELD

The present invention relates to a thermosetting adhesive film and a coverlay film including the same, and more specifically to a thermosetting adhesive film which has excellent ion migration resistance while having a low dielectric permittivity, as well as excellent peel-off strength, and to a coverlay film including the same.

BACKGROUND ART

Recently, due to the miniaturization, light weight, thin film and integration trends in the electronic industry, the use of flexible printed circuit boards (FPCBs) is increasing, and the development of technology is accelerating.

However, adhesive technologies used for coverlay films, bonding sheets and metal laminates do not correspond to the rapid technological development of electronic product manufacturers and flexible circuit board manufacturers, such as high-capacity high-speed transmission and implementation of micro-scale fine circuits.

A typical example thereof is the ion migration phenomenon.

The ion migration phenomenon occurs on adhesives used in coverlay films, bonding sheets and metal laminates, and it occurs when there is an applied voltage between media, moisture and conductors.

In a general flexible printed circuit board, the medium becomes an adhesive, and the ion migration phenomenon is accelerated due to ionic residues and moisture contained in the adhesive.

In the related art, adhesive compositions applied to coverlay films, bonding sheets and metal laminates can maintain high heat resistance and stable peel strength, but cannot prevent the ion migration phenomenon.

Even in the case of advanced technology in Japan and the like, it was only used by increasing the purity of acrylonitrile butadiene rubber as a method for delaying ion migration. In this case, although the ion migration phenomenon was partially suppressed and delayed through the removal of impurities in rubber, it was not a complete solution, and there was a problem in that the price of raw materials increased by more than 10 times compared to the previous technique, and the problem of discoloration at high temperatures could not be addressed.

Meanwhile, since the data transmission speed of the 5G generation is expected to be faster than that of 4G-class mobile communication, it is necessary to develop materials corresponding to high speed and high frequency to respond to the demand for high performance and high functionality of information communication devices. Therefore, when the dielectric constant of an adhesive that can constitute the coverlay film, bonding sheet and metal laminate used in digital home appliances such as mobile phones, digital camcorders, laptop computers and LCD monitors is large, signal transmission is delayed, and since it delays the improvement of transmission speed, materials with a low permittivity must be used.

However, in terms of adhesives used for coverlay films, bonding sheets and metal laminates, there have been problems in that it is difficult to develop adhesives capable of delaying ion migration and having a low permittivity.

DISCLOSURE

Technical Tasks

The present invention has been devised to solve the above problems, and the problems to be solved by the present invention are directed to providing a thermosetting adhesive film having excellent ionic migration resistance, low permittivity and excellent peel strength.

In addition, by applying the thermosetting adhesive film of the present invention, it is possible to provide a coverlay film, a bonding sheet or a metal laminate having excellent ionic migration resistance and a low permittivity at the same time.

Technical Solution

In order to solve the above-described tasks, the thermosetting adhesive film of the present invention includes an epoxy resin which is solid at a temperature of 15° C. to 28° C., a thermosetting acrylic rubber which is solid at a temperature of 15° C. to 28° C. and a phosphorus-based flame retardant.

In a preferred exemplary embodiment of the present invention, the thermosetting acrylic rubber may include a hydroxy group and a carboxyl group as functional groups.

In a preferred exemplary embodiment of the present invention, the thermosetting acrylic rubber may have a weight average molecular weight (Mw) of 400,000 to 1,500,000.

In a preferred exemplary embodiment of the present invention, the thermosetting acrylic rubber may have a glass transition temperature (Tg) of −10° C. to 15° C.

In a preferred exemplary embodiment of the present invention, the thermosetting adhesive film of the present invention may satisfy Condition (1):

$$A > 100 \text{ M}\Omega \tag{1}$$

wherein in Condition (1) above, A represents the insulation resistance measured for 500 to 1,000 hours under the conditions of a temperature of 85° C., a relative humidity of 85% and a DC voltage of 50V according to the IPC-TM 650 test standard.

In a preferred exemplary embodiment of the present invention, the thermosetting adhesive film of the present invention may satisfy Condition (2):

$$B_1 \leq 3.3, B_2 \leq 3.1 \tag{2}$$

wherein in Condition (2) above, $B_1$ represents the dielectric constant at 1 GHz, and $B_2$ represents the dielectric constant at 10 GHz.

In a preferred exemplary embodiment of the present invention, the thermosetting adhesive film of the present invention may satisfy Condition (3):

$$C \geq 0.7 \text{ kgf/cm} \tag{3}$$

wherein in Condition (3) above, C represents the peel strength measured at the time of peeling under the conditions of a speed of 50 mm/min and a peeling direction of 90°.

In a preferred exemplary embodiment of the present invention, the thermosetting adhesive film of the present invention may satisfy Condition (4):

$$D \leq 0.5\% \tag{4}$$

wherein in Condition (4) above, D represents the measured moisture absorption measured according to Relationship Formula 1 below according to the IPC TM-650 test standard:

$$\text{Moisture absorption (\%)} = (D_1 - D_0)/D_0 \times 100 \text{ [Relationship Formula 1]}$$

wherein in Relationship Formula 1 above, $D_0$ represents the weight of a dried thermosetting adhesive film, and $D_1$ represents the weight after immersing a dried thermosetting adhesive in distilled water for 24 hours.

In a preferred exemplary embodiment of the present invention, the thermosetting adhesive film of the present invention may satisfy Condition (5):

$$65°\text{ C.} \leq E \leq 85°\text{ C.} \tag{5}$$

wherein in Condition (5) above, E represents the glass transition temperature (Tg).

In a preferred exemplary embodiment of the present invention, the thermosetting adhesive film of the present invention may satisfy Condition (6):

$$65 \text{ ppm}/°\text{ C.} \leq F_1 \leq 95 \text{ ppm}/°\text{ C.}, 200 \text{ ppm}/°\text{ C.} \leq F_2 \leq 280 \text{ ppm}/°\text{ C.} \tag{6}$$

wherein in Condition (6) above, $F_1$ represents the coefficient of thermal expansion before reaching the glass transition temperature (Tg), when the temperature is raised at a rate of 10° C./min, and $F_2$ represents the coefficient of thermal expansion after reaching the glass transition temperature (Tg), when the temperature is raised at a rate of 10° C./min.

In a preferred exemplary embodiment of the present invention, the thermosetting adhesive film of the present invention may satisfy Condition (7):

$$20 \text{ MPa} \leq G \leq 50 \text{ MPa} \tag{7}$$

wherein in Condition (7) above, G represents the tensile strength measured according to the IPC TM-650 test standard.

In a preferred exemplary embodiment of the present invention, the thermosetting adhesive film of the present invention may satisfy Condition (8):

$$0.3 \text{ GPa} \leq H \leq 1.0 \text{ GPa} \tag{8}$$

wherein in Condition (8) above, H represents Young's Modulus measured according to the IPC TM-650 test standard.

In a preferred exemplary embodiment of the present invention, the thermosetting adhesive film of the present invention may satisfy Condition (9):

$$30\% \leq I \leq 130\% \tag{9}$$

wherein in Condition (9) above, I represents the elongation measured according to the IPC TM-650 test standard.

In a preferred exemplary embodiment of the present invention, the epoxy resin may include at least two selected from bisphenol-A type epoxy resin, O-cresol novolac type epoxy resin, phenol novolac type epoxy resin, low-chlorine type epoxy resin, dicyclopentadiene type epoxy resin, biphenyl type epoxy resin and multi-functional novolac type epoxy resin.

In a preferred exemplary embodiment of the present invention, the epoxy resin may have a softening point of 60 to 80° C. and an epoxy equivalent weight of 200 to 350 g/eq.

In a preferred exemplary embodiment of the present invention, the thermosetting acrylic rubber may be a polymer obtained by polymerization by including a monomer mixture including at least three selected from a butyl acrylate monomer, a 2-ethylhexyl acrylate monomer, a 2-methoxyethyl acrylate monomer, a 4-hydroxybuthyl acrylate monomer, an ethyl acrylate monomer, a 2-hydroxyethyl acrylate monomer, a 2-hydroxypropyl acrylate monomer, a pentylmethacrylate monomer, a 2-hydroxymethyl acrylate monomer, an ethylmethacrylate monomer, a methylmethacrylate monomer, an acrylic acid monomer and an acrylonitrile monomer.

In a preferred exemplary embodiment of the present invention, the thermosetting acrylic rubber may have an acid value of 30 to 45 and a viscosity of 500 to 8,000 cps.

In a preferred exemplary embodiment of the present invention, the phosphorus-based flame retardant may include at least one selected from a phosphate-based flame retardant, a phosphazene-based flame retardant and a phosphinate-based flame retardant.

In a preferred exemplary embodiment of the present invention, the thermosetting adhesive film may include 120 to 180 parts by weight of the epoxy resin and 10 to 40 parts by weight of the phosphorus-based flame retardant, based on 100 parts by weight of the thermosetting acrylic rubber.

In a preferred exemplary embodiment of the present invention, the thermosetting adhesive film may further include at least one selected from a curing agent and an inorganic filler.

In a preferred exemplary embodiment of the present invention, the thermosetting adhesive film may include 8 to 18 parts by weight of the curing agent and 20 to 40 parts by weight of the inorganic filler, based on 100 parts by weight of the thermosetting acrylic rubber.

In a preferred exemplary embodiment of the present invention, the curing agent may include at least one selected from an amine-based curing agent, an imidazole-based curing agent and an acid anhydride-based curing agent.

In a preferred exemplary embodiment of the present invention, the inorganic filler may include at least one selected from aluminum hydroxide, magnesium hydroxide, silica, alumina, zinc oxide, magnesium oxide, zirconium oxide, titanium oxide, iron oxide, cobalt oxide and chromium oxide.

Meanwhile, the coverlay film of the present invention may include an electrically insulating substrate; the thermosetting adhesive film of the present invention which is formed on one surface of the electrically insulating substrate; and a release film which is formed on one surface of the thermosetting adhesive film.

Advantageous Effects

The thermosetting adhesive film and the coverlay film including the same according to the present invention not only have excellent ionic migration resistance and low permittivity, but also have excellent peel strength.

MODE OF THE INVENTION

Figure 1:
FIG. 1 is a cross-sectional diagram of the coverlay film according to a preferred embodiment of the present invention.

Hereinafter, with reference to the accompanying drawings, exemplary embodiments of the present invention will be described in detail so that those skilled in the art can easily practice the present invention. The present invention may be embodied in many different forms and is not limited to the exemplary embodiments set forth herein. In order to clearly describe the present invention in the drawings, parts that are irrelevant to the description are omitted, and the same reference numerals are assigned to the same or similar components throughout the specification.

The thermosetting adhesive film of the present invention may include an epoxy resin which is solid at a temperature of 15 to 28° C., and preferably 20 to 26° C., a thermosetting acrylic rubber which is solid at a temperature of 15 to 28° C., and preferably 20 to 26° C., and a phosphorus-based flame retardant.

First, the epoxy resin of the present invention is capable of improving the crosslinking density and reducing the moisture absorption and chlorine content, and may include at least two, and preferably two to four selected from bisphenol-A type epoxy resin, bisphenol-F type epoxy resin, O-cresol novolac type epoxy resin, phenol novolac type epoxy resin, low-chlorine type epoxy resin, dicyclopentadiene type epoxy resin, biphenyl type epoxy resin and multifunctional novolac type epoxy resin. If only one of the epoxy resins listed above is used as the epoxy resin of the present invention, there may be a problem in that not only the adhesive strength is lowered but also the odor resistance is lowered.

Specifically, the epoxy resin of the present invention may have a softening point of 60 to 80° C., and preferably 66 to 75° C., and an epoxy equivalent weight of 200 to 350 g/eq, and preferably 240 to 300 g/eq. If the epoxy equivalent weight is less than 200 g/eq, it may be difficult to control the resin flow, and if it is more than 350 g/eq, chemical resistance may be deteriorated.

Next, the thermosetting acrylic rubber of the present invention can control resin flow and improve odor resistance, and it may be a polymer obtained by polymerizing various monomer mixtures. Specifically, the thermosetting acrylic rubber may be a polymer obtained by polymerization by including a monomer mixture including at least three, and preferably three to five selected from a butyl acrylate monomer, a 2-ethylhexyl acrylate monomer, a 2-methoxyethyl acrylate monomer, a 4-hydroxybuthyl acrylate monomer, an ethyl acrylate monomer, a 2-hydroxyethyl acrylate monomer, a 2-hydroxypropyl acrylate monomer, a pentylmethacrylate monomer, a 2-hydroxymethyl acrylate monomer, an ethylmethacrylate monomer, a methylmethacrylate monomer, an acrylic acid monomer and an acrylonitrile monomer. If the thermosetting acrylic rubber of the present invention is a polymerized product including less than three of the above-listed monomers, there may be a problem in that the mechanical strength (tensile strength, Young's modulus, etc.) is lowered.

In addition, the thermosetting acrylic rubber of the present invention may include a hydroxy group and a carboxyl group as functional groups, and if it does not include either a hydroxy group or a carboxyl group as a functional group, there may be a problem of the deterioration of compatibility with epoxy and the deterioration of adhesive strength.

In addition, the thermosetting acrylic rubber of the present invention may have a weight average molecular weight (Mw) of 400,000 to 1,500,000, and preferably 800,000 to 1,100,000, and if the weight average molecular weight is less than 400,000, there may be problems of excessive resin flow and deterioration in odor resistance, and if it is more than 1,500,000, there may be a problem of deterioration in workability due to an increase in viscosity.

In addition, the thermosetting acrylic rubber of the present invention may have a glass transition temperature (Tg) of −10 to 15° C., and preferably −5 to 10° C., and if the glass transition temperature is less than −10° C., there may be a problem of increasing surface tackiness of the adhesive, and if it is more than 15° C., there may be a problem of deterioration in odor resistance of the adhesive, especially in a low temperature state of 10° C. or less.

In addition, the thermosetting acrylic rubber of the present invention may have an acid value of 30 to 45, and preferably an acid value of 35 to 41, and if the acid value is less than 30, there may be a problem of deterioration in adhesive strength, and if it is more than 45, there may be a problem of the deterioration of the stability of the mixture.

In addition, the thermosetting acrylic rubber of the present invention may have a viscosity of 500 to 8,000 cps, and preferably 4,000 to 6,000 cps, and if the viscosity is less than 500 cps, there may be a problem in the deterioration of mixing stability (flame retardant sedimentation, aggregation, etc.), and if it is more than 8,000 cps, there may be a problem of deteriorations in mixing and mixing workability.

Next, the phosphorus-based flame retardant of the present invention can not only provide a flame retardant effect, but also secure heat resistance, and it may include at least one selected from a phosphate-based flame retardant, a phosphazene-based flame retardant and a phosphinate-based flame retardant, and preferably, it may include at least one selected from a phosphate-based flame retardant and a phosphazene-based flame retardant.

Meanwhile, the thermosetting adhesive film of the present invention may include 120 to 180 parts by weight of the epoxy resin, and preferably 140 to 160 parts by weight, based on 100 parts by weight of the thermosetting acrylic rubber, and if the epoxy resin is included at less than 120 parts by weight, there may be a problem of deterioration in adhesion and heat resistance, and if is more than exceeds 180 parts by weight, there may be a problem of excessive resin flow.

In addition, the thermosetting adhesive film of the present invention may include 10 to 40 parts by weight, and preferably 15 to 30 parts by weight of the phosphorus-based flame retardant, based on 100 parts by weight of the thermosetting acrylic rubber, and if the phosphorus-based flame retardant is included at less than 10 parts by weight, there may be a problem of non-secured flame retardancy, and if it is more than 40 parts by weight, there may be a problem of the deterioration of heat resistance.

Furthermore, the thermosetting adhesive film of the present invention may further include at least one selected from a curing agent and an inorganic filler, and preferably may further include a curing agent and an inorganic filler.

The curing agent of the present invention is capable of forming a crosslinking of an epoxy resin, and it may include at least one selected from an amine-based curing agent, an imidazole-based curing agent and an acid anhydride-based curing agent.

In addition, the inorganic filler of the present invention is a material capable of improving mechanical strength as well as providing a flame retardant effect, and it may include at least one selected from aluminum hydroxide, magnesium hydroxide, silica, alumina, zinc oxide, magnesium oxide, zirconium oxide, titanium oxide, iron oxide, cobalt oxide and chromium oxide.

Meanwhile, the thermosetting adhesive film of the present invention may include 8 to 18 parts by weight, and preferably 10 to 16 parts by of the curing agent, weight, based on 100 parts by weight of the thermosetting acrylic rubber, and if the curing agent is included at less than 8 parts by weight, there may be a problem of deterioration in heat resistance due to non-curing of the adhesive component, and if it is included at more than 18 parts by weight, there may be a problem of deteriorations in adhesive strength and long-term storage workability (rapid change over time) due to over-curing of the adhesive component.

In addition, the thermosetting adhesive film of the present invention may include 20 to 40 parts by weight, and preferably 25 to 35 parts by weight of the inorganic filler, based on 100 parts by weight of the thermosetting acrylic rubber, and if the inorganic filler is included at less than 20 parts by weight, there may be a problem of deterioration in mechanical strength, and if it is included at more than 40 parts by weight, there may be problems of sedimentation and aggregation of the inorganic filler.

Furthermore, the thermosetting adhesive film of the present invention may further include an organic solvent to facilitate workability by adjusting the viscosity, and it may include methyl ethyl ketone as the organic solvent.

In addition, the thermosetting adhesive film of the present invention may further include various additives to improve physical properties, and preferably, it may further include at least one selected from a polyester-based raw material, a silane coupling agent and a surfactant.

Meanwhile, the thermosetting adhesive film of the present invention may satisfy all of Conditions (1) to (3):

$$A > 100 \text{ M}\Omega, \text{preferably } 500 \text{ M}\Omega \leq A \leq 11,000 \text{ MS}\Omega, \text{ and more preferably } 1,000 \text{ M}\Omega \leq A \leq 5,000 \text{ M}\Omega \tag{1}$$

wherein in Condition (1) above, A represents the insulation resistance measured for 500 to 1,000 hours under the conditions of a temperature of 85° C., a relative humidity of 85% and a DC voltage of 50V according to the IPC-TM 650 test standard.

$$B_1 \leq 3.3, B_2 \leq 3.1, \text{preferably } 2.9 \leq B_1 \leq 3.3, 2.8 \leq B_2 \leq 3.1, \text{ and more preferably } 3.1 \leq B_1 \leq 3.25, 3.0 \leq B_2 \leq 3.1 \tag{2}$$

wherein in Condition (2) above, $B_1$ represents the dielectric constant at 1 GHz, and $B_2$ represents the dielectric constant at 10 GHz.

$$C \geq 0.7 \text{ kgf/cm}, \text{preferably } 1.2 \text{ kgf/cm} \leq C \leq 2.2 \text{ kgf/cm}, \text{ and more preferably } 1.7 \text{ kgf/cm} \leq C \leq 2.0 \text{ kgf/cm} \tag{3}$$

wherein in Condition (3) above, C represents the peel strength measured at the time of peeling under the conditions of a speed of 50 mm/min and a peeling direction of 90°.

In addition, the thermosetting adhesive film of the present invention may satisfy further Condition (4):

$$D \leq 0.5\%, \text{preferably } 0.1\% \leq D \leq 0.4\%, \text{ and more preferably } 0.2\% \leq D \leq 0.3\% \tag{4}$$

wherein in Condition (4) above, D represents the measured moisture absorption measured according to Relationship Formula 1 below according to the IPC TM-650 test standard:

$$\text{Moisture absorption } (\%) = (D_1 - D_0)/D_0 \times 100 \text{ [Relationship Formula 1]}$$

wherein in Relationship Formula 1 above, $D_0$ represents the weight of a dried thermosetting adhesive film, and $D_1$ represents the weight after immersing a dried thermosetting adhesive in distilled water for 24 hours.

In addition, the thermosetting adhesive film of the present invention may further satisfy Condition (5):

$$65° \text{ C.} \leq E \leq 85° \text{ C.}, \text{preferably } 68° \text{ C.} \leq E \leq 80° \text{ C.}, \text{ and more preferably } 70° \text{ C.} \leq E \leq 75° \text{ C.} \tag{5}$$

wherein in Condition (5) above, E represents the glass transition temperature (Tg), and if the glass transition ion is less than 65° C., there may be a problem of surface tackiness of the adhesive film, and if it is more than 85° C., there may be a problem of deteriorations in odor resistance and adhesive strength.

In addition, the thermosetting adhesive film of the present invention may further satisfy Condition (6):

$$65 \text{ ppm/°C.} \leq F_1 \leq 95 \text{ ppm/°C.}, 200 \text{ ppm/°C.} \leq F_2 \leq 280 \text{ ppm/°C.}, \text{preferably } 75 \text{ ppm/°C.} \leq F_1 \leq 90 \text{ ppm/°C.}, 220 \text{ ppm/°C.} \leq F_2 \leq 260 \text{ ppm/°C.}, \text{ and more preferably } 80 \text{ ppm/°C.} \leq F_1 \leq 85 \text{ ppm/°C.}, 240 \text{ ppm/°C.} \leq F_2 \leq 250 \text{ ppm/°C.} \tag{6}$$

wherein in Condition (6) above, $F_1$ represents the coefficient of thermal expansion before reaching the glass transition temperature (Tg), when the temperature is raised at a rate of 10° C./min, and $F_2$ represents the coefficient of thermal expansion after reaching the glass transition temperature (Tg), when the temperature is raised at a rate of 10° C./min.

In addition, the thermosetting adhesive film of the present invention may further satisfy Condition (7):

$$20 \text{ MPa} \leq G \leq 50 \text{ MPa}, \text{preferably } 22 \text{ MPa} \leq G \leq 40 \text{ MPa}, \text{ and more preferably } 25 \text{ MPa} \leq G \leq 33 \text{ MPa} \tag{7}$$

wherein in Condition (7) above, G represents the tensile strength measured according to the IPC TM-650 test standard.

In addition, the thermosetting adhesive film of the present invention may further satisfy Condition (8):

$$0.3 \text{ GPa} \leq H \leq 1.0 \text{ GPa}, \text{preferably } 0.4 \text{ GPa} \leq H \leq 0.8 \text{ GPa}, \text{ and more preferably } 0.5 \text{ GPa} \leq H \leq 0.7 \text{ GPa} \tag{8}$$

wherein in Condition (8) above, H represents Young's Modulus measured according to the IPC TM-650 test standard.

In addition, the thermosetting adhesive film of the present invention may further satisfy Condition (9):

$$30\% \leq I \leq 130\%, \text{preferably } 40\% \leq I \leq 120\%, \text{more preferably } 60\% \leq I \leq 120\%, \text{ and still more preferably } 100\% \leq I \leq 120\% \tag{9}$$

wherein in Condition (9) above, I represents the elongation measured according to the IPC TM-650 test standard.

Furthermore, referring to FIG. 1, the coverlay film of the present invention may include an electrical insulating substrate 20, a thermosetting adhesive film 10 formed on one surface of the electrical insulating substrate, and a release film 30 formed on one surface of the thermosetting adhesive film 10. In this case, the thermosetting adhesive film 10 may include the aforementioned thermosetting adhesive film of the present invention.

Additionally, although the coverlay film including the thermosetting adhesive film of the present invention has been mentioned as a representative, the thermosetting adhesive film of the present invention is not limited thereto, and it may be certainly applied to bonding sheets, metal laminates and the like as it is.

In addition, each of the electrical insulating substrate 10 and the release film 30 is not particularly limited, but polyimide (PI), polyethylene terephthalate (PET), polyethylene naphthalate (PEN), liquid crystal polymer (LCP) film, aramid film, a fluorine-based film or the like may be generally applied, and preferably, a polyimide film may be applied as the electrical insulating substrate when the high-temperature dimensional stability is required at a temperature of 240° C. or higher, and a polyethylene terephthalate (PET) film may be applied as the release film.

Hereinafter, the present invention will be described through the following examples. In this case, the following examples are only presented to illustrate the invention, and the scope of the present invention is not limited by the following examples.

EXAMPLES

Example 1: Preparation of Thermosetting Adhesive Film

A thermosetting acrylic rubber which is solid at a temperature of 20 to 26° C. and includes a hydroxyl group and a carboxyl group as functional groups, an epoxy resin which is solid at a temperature of 20 to 26° C., a phosphorous-based flame retardant, a curing agent and an inorganic filler were mixed in methyl ethyl ketone, which is an organic solvent, to prepare a mixture, and the prepared mixture was dried in an oven for 20 minutes to prepare a thermosetting adhesive film having a thickness of 20 μm and a glass transition temperature (Tg) of 73° C.

In this case, 150 parts by weight of the epoxy resin, 20 parts by weight of the phosphorus-based flame retardant, 13 parts by weight of the curing agent and 30 parts by weight of the inorganic filler were mixed based on 100 parts by weight of the thermosetting acrylic rubber, and as the thermosetting acrylic rubber (solid content: 20 wt. %), a polymer obtained by polymerizing an ethyl acrylate monomer, an acrylonitrile monomer, a 2-hydroxyethyl acrylate monomer and an ethyl methacrylate monomer at a weight ratio of 1:6:1:2 was used, and a polymer having a weight average molecular weight (Mw) of 850,000, a glass transition temperature (Tg) of 5.85° C., an acid value of 37.5 and a viscosity of 5,000 cps was used.

In addition, an epoxy resin having a softening point of 71° C. and an epoxy equivalent weight of 270 g/eq was used, and based on 100 parts by weight of a bisphenol A type epoxy resin which is solid at a temperature of 20 to 26° C., a mixture obtained by mixing 30 parts by weight of a liquid bisphenol A-type epoxy resin and 20 parts by weight of a phenol novolac type epoxy resin, which are liquid at a temperature of 20 to 26° C., was used.

In addition, a phosphazene-based flame retardant was used as the phosphorus-based flame retardant, and as the curing agent, a mixture obtained by mixing 10 parts by weight of an amine-based curing agent and 3 parts by weight of an imidazole-based curing agent was used, and aluminum hydroxide was used as the inorganic filler.

Example 2: Preparation of Thermosetting Adhesive Film

A thermosetting adhesive film was prepared in the same manner as in Example 1. However, unlike Example 1, 110 parts by weight of an epoxy resin was mixed, based on 100 parts by weight of the thermosetting acrylic rubber, to finally prepare a thermosetting adhesive film. In this case, an epoxy resin having a softening point of 71° C. and an epoxy equivalent weight of 270 g/eq was used, and 110 parts by weight of the epoxy resin were a mixture obtained by mixing 73 parts by weight of a bisphenol A type epoxy resin which is solid at a temperature of 20 to 26° C., 22 parts by weight of a bisphenol A type epoxy resin which is liquid at a temperature of 20 to 26° C. and 15 parts by weight of a phenol novolac type epoxy resin.

Example 3: Preparation of Thermosetting Adhesive Film

A thermosetting adhesive film was prepared in the same manner as in Example 1. However, unlike Example 1, 190 parts by weight of an epoxy resin was mixed, based on 100 parts by weight of the thermosetting acrylic rubber, to finally prepare a thermosetting adhesive film. In this case, an epoxy resin having a softening point of 71° C. and an epoxy equivalent weight of 270 g/eq was used, and 190 parts by weight of the epoxy resin were a mixture obtained by mixing 127 parts by weight of a bisphenol A type epoxy resin which is solid at a temperature of 20 to 26° C., 38 parts by weight of a bisphenol A type epoxy resin which is liquid at a temperature of 20 to 26° C. and 25 parts by weight of a phenol novolac type epoxy resin.

Example 4: Preparation of Thermosetting Adhesive Film

A thermosetting adhesive film was prepared in the same manner as in Example 1. However, unlike Example 1, as the epoxy resin, a mixture obtained by mixing 30 parts by weight of bisphenol A type epoxy resin, which is liquid at a temperature of 20 to 26° C., based on 100 parts by weight of bisphenol A type epoxy resin, which is solid at a temperature of 20 to 26° C., was used to finally prepare a thermosetting adhesive film. In this case, the epoxy resin had a softening point of 67° C. and an epoxy equivalent weight of 285 g/eq.

Example 5: Preparation of Thermosetting Adhesive Film

A thermosetting adhesive film was prepared in the same manner as in Example 1. However, unlike Example 1, as the epoxy resin, a mixture obtained by mixing 20 parts by weight of a phenol novolac type epoxy resin, based on 100 parts by weight of a bisphenol A type epoxy resin, which is solid at a temperature of 20 to 26° C., was used to finally prepare a thermosetting adhesive film. In this case, the epoxy resin had a softening point of 77° C. and an epoxy equivalent weight of 291 g/eq.

Example 6: Preparation of Thermosetting Adhesive Film

A thermosetting adhesive film was prepared in the same manner as in Example 1. However, unlike Example 1, as the epoxy resin, a mixture obtained by mixing 30 parts by weight of a bisphenol A type epoxy resin, which is solid at a temperature of 20 to 26° C., based on 100 parts by weight of a bisphenol A type epoxy resin, which is liquid at a temperature of 20 to 26° C., was used to finally prepare a thermosetting adhesive film. In this case, the epoxy resin had a softening point of 52° C. and an epoxy equivalent weight of 190 g/eq.

Example 7: Preparation of Thermosetting Adhesive Film

A thermosetting adhesive film was prepared in the same manner as in Example 1. However, unlike Example 1, as the epoxy resin, a mixture obtained by mixing 30 parts by weight of a bisphenol F-type epoxy resin, which is liquid at a temperature of 20 to 26° C., based on 100 parts by weight of a bisphenol F-type epoxy resin, which is solid at a temperature of 20 to 26° C., was used to finally prepare a thermosetting adhesive film. In this case, the epoxy resin had a softening point of 85° C. and an epoxy equivalent weight of 364 g/eq.

Example 8: Preparation of Thermosetting Adhesive Film

A thermosetting adhesive film was prepared in the same manner as in Example 1. However, unlike Example 1, as the thermosetting acrylic rubber (solid content: 20 wt. %), a polymer obtained by polymerizing an ethyl acrylate monomer, an acrylonitrile monomer, a 2-hydroxyethyl acrylate monomer and an ethyl methacrylate monomer at a ratio of 1:6:1:2 was used to finally prepare a thermosetting adhesive film. In this case, the thermosetting acrylic rubber having a weight average molecular weight (Mw) of 830,000, a glass transition temperature (Tg) of 5.6° C., an acid value of 19.7 and a viscosity of 4,900 cps was used.

Example 9: Preparation of Thermosetting Adhesive Film

A thermosetting adhesive film was prepared in the same manner as in Example 1. However, unlike Example 1, as the thermosetting acrylic rubber (solid content: 20 wt. %), a polymer obtained by polymerizing an ethyl acrylate monomer, an acrylonitrile monomer, a 2-hydroxyethyl acrylate monomer and an ethyl methacrylate monomer at a ratio of 1:6:1:2 was used to finally prepare a thermosetting adhesive film. In this case, the thermosetting acrylic rubber having a weight average molecular weight (Mw) of 350,000, a glass transition temperature (Tg) of 4.3° C., an acid value of 35.6 and a viscosity of 2,100 cps was used.

Example 10: Preparation of Thermosetting Adhesive Film

A thermosetting adhesive film was prepared in the same manner as in Example 1. However, unlike Example 1, a thermosetting adhesive film was finally prepared by using a phosphate-based flame retardant instead of a phosphazene-based flame retardant as the phosphorus-based flame retardant.

Example 11: Preparation of Thermosetting Adhesive Film

A thermosetting adhesive film was prepared in the same manner as in Example 1. However, unlike Example 1, a thermosetting adhesive film was finally prepared by using a nitrogen-based melamine compound flame retardant instead of a phosphazene-based flame retardant as the phosphorus-based flame retardant.

Example 12: Preparation of Thermosetting Adhesive Film

A thermosetting adhesive film was prepared in the same manner as in Example 1. However, unlike Example 1, a thermosetting adhesive film was finally prepared by mixing 5 parts by weight of a phosphorus-based flame retardant based on 100 parts by weight of the thermosetting acrylic rubber.

Example 13: Preparation of Thermosetting Adhesive Film

A thermosetting adhesive film was prepared in the same manner as in Example 1. However, unlike Example 1, a thermosetting adhesive film was finally prepared by mixing 45 parts by weight of a phosphorus-based flame retardant based on 100 parts by weight of the thermosetting acrylic rubber.

Comparative Example 1: Preparation of Thermosetting Adhesive Film

A thermosetting adhesive film was prepared in the same manner as in Example 1. However, unlike Example 1, as the thermosetting acrylic rubber (solid content: 20 wt. %), a polymer obtained by polymerizing an ethyl acrylate monomer, an acrylonitrile monomer, a 2-hydroxyethyl acrylate monomer and an ethyl methacrylate monomer at a ratio of 1:5:1:1 was used to finally prepare a thermosetting adhesive film. In this case, a thermosetting acrylic rubber having a weight average molecular weight (Mw) of 830,000, a glass transition temperature (Tg) of −16° C., an acid value of 35.0 and a viscosity of 4,000 cps was used.

Comparative Example 2: Preparation of Thermosetting Adhesive Film

A thermosetting adhesive film was prepared in the same manner as in Example 1. However, unlike Example 1, as the thermosetting acrylic rubber (solid content: 20 wt. %), a polymer obtained by polymerizing an ethyl acrylate monomer, an acrylonitrile monomer, a 2-hydroxyethyl acrylate monomer and an ethyl methacrylate monomer at a ratio of 1:4.5:1:2 was used to finally prepare a thermosetting adhesive film. In this case, a thermosetting acrylic rubber having a weight average molecular weight (Mw) of 790,000, a glass transition temperature (Tg) of 20° C., an acid value of 36.3 and a viscosity of 4,200cps was used.

Example 14: Preparation of Thermosetting Adhesive Film

A mixture was prepared by mixing a thermosetting acrylic rubber which is solid at a temperature of 20 to 26° C. and includes a hydroxy group and a carboxyl group as functional groups, an epoxy resin which is solid at a temperature of 20 to 26° C., a phosphorus-based flame retardant, a curing agent and an inorganic filler in in methyl ethyl ketone, which is an organic solvent, and the prepared mixture was dried in an oven at 150° C. for 2 minutes to prepare a thermosetting adhesive film having a thickness of 20 μm and a glass transition temperature (Tg) of 64° C.

In this case, based on 100 parts by weight of the thermosetting acrylic rubber, 150 parts by weight of the epoxy resin, 20 parts by weight of the phosphorus-based flame retardant, 13 parts by weight of the curing agent and 30 parts by weight of the inorganic filler were mixed, and as the thermosetting acrylic rubber (solid content: 20 wt. %), a polymer obtained by polymerizing an ethyl acrylate monomer, an acrylonitrile monomer, a 2-hydroxyethyl acrylate monomer and an ethyl methacrylate monomer at a weight ratio of 1:5.2:1:0.5 was used, and a thermosetting acrylic rubber having a weight average molecular weight (Mw) of 790,000, a glass transition temperature (Tg) of −8° C., an acid value of 36.2 and a viscosity of 3,900 cps was used. In addition, as the epoxy resin, a mixture obtained by mixing 50 parts by weight of a bisphenol A type epoxy resin, which is liquid at a temperature of 20 to 26° C., based on 100 parts by weight of a bisphenol A type epoxy resin which is solid at a temperature of 20 to 26° C. was used. In addition, a phosphazene-based flame retardant was used as the phosphorus-based flame retardant, and a mixture obtained by mixing 10 parts by weight of an amine-based curing agent and 3 parts by weight of an imidazole-based curing agent was used as the curing agent, and aluminum hydroxide was used as the inorganic filler.

Example 15: Preparation of Thermosetting Adhesive Film

A mixture was prepared by mixing a thermosetting acrylic rubber which is solid at a temperature of 20 to 26° C. and includes a hydroxy group and a carboxyl group as functional groups, an epoxy resin which is solid at a temperature of 20 to 26° C., a phosphorus-based flame retardant, a curing agent and an inorganic filler in in methyl ethyl ketone, which is an organic solvent, and the prepared mixture was dried in an oven at 150° C. for 2 minutes to prepare a thermosetting adhesive film having a thickness of 20 μm and a glass transition temperature (Tg) of 83° C. In this case, based on 100 parts by weight of the thermosetting acrylic rubber, 150 parts by weight of the epoxy resin, 20 parts by weight of the phosphorus-based flame retardant, 13 parts by weight of the curing agent and 30 parts by weight of the inorganic filler were mixed, and as the thermosetting acrylic rubber (solid content: 20 wt. %), a polymer obtained by polymerizing an ethyl acrylate monomer, an acrylonitrile monomer, a 2-hydroxyethyl acrylate monomer and an ethyl methacrylate monomer at a weight ratio of 1:4.8:1:2 was used, and a thermosetting acrylic rubber having a weight average molecular weight (Mw) of 820,000, a glass transition temperature (Tg) of 13° C., an acid value of 37.1 and a viscosity of 4,000 cps was used. In addition, as the epoxy resin, a mixture obtained by mixing 50 parts by weight of a bisphenol novolac type epoxy resin based on 100 parts by weight of a bisphenol A type epoxy resin which is solid at a temperature of 20 to 26° C. was used. In addition, a phosphazene-based flame retardant was used as the phosphorus-based flame retardant, and a mixture obtained by mixing 10 parts by weight of an amine-based curing agent and 3 parts by weight of an imidazole-based curing agent was used as the curing agent, and aluminum hydroxide was used as the inorganic filler.

Experimental Example 1

The following physical properties were measured for each of the thermosetting adhesive films prepared in Examples 1 to 15 and Comparative Examples 1 to 2, and the results are shown in Tables 1 to 5 below.

1. Insulation Resistance (Evaluation of Migration)

According to the IPC-TM 650 test standard, the insulation resistance (MΩ) of the thermosetting adhesive films prepared in Examples 1 to 15 and Comparative Examples 1 to 2 was measured.

Figure 2:
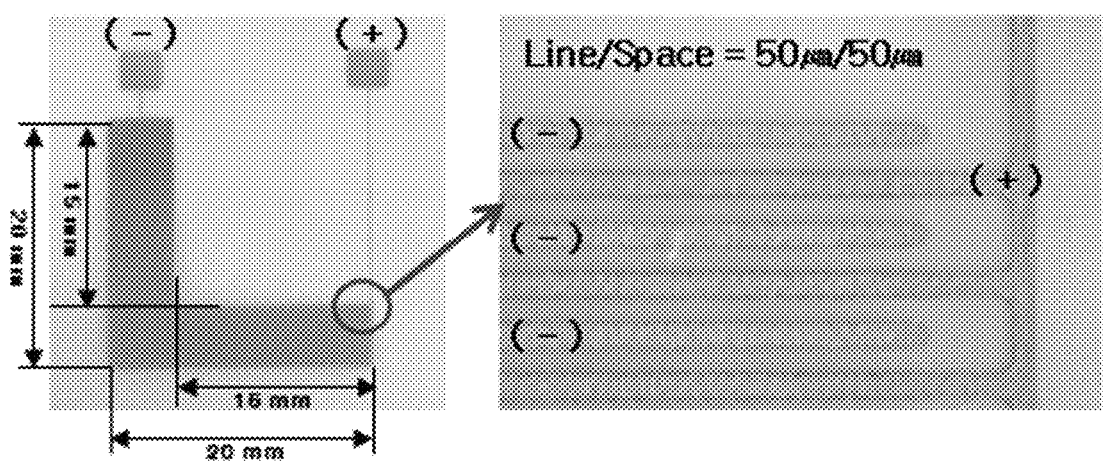
FIG. 2 is a diagram showing an electrode pattern for measuring the insulation resistance of a thermosetting adhesive film.

Specifically, as illustrated in FIG. 2, a polyimide (PI) film (thickness: 25 μm) having a comb-shaped structure pattern in which the cathode and anode were crossed on one surface was prepared, and each of the thermosetting adhesive films prepared in Examples 1 to 15 and Comparative Examples 1 to 2 was laminated on the patterned polyimide film to prepare specimens, and AMI-025-U-5 (Espec Corp., Japan) was used as an insulation resistance measurement facility to measure the insulation resistance of specimens for 1,000 hours under the conditions of a temperature of 85° C., a relative humidity of 85% and a DC voltage of 50V (used water: ultra-pure water at 10 MΩ·cm or more), and during the measurement time, the average insulation resistance measured for 500 to 1,000 hours is shown in Tables 1 to 5 below.

2. Permittivity

After positioning each of the thermosetting adhesive films prepared through Examples 1 to 15 and Comparative Examples 1 to 2 between a first release film for hot press and a second release film for hot press, specimens were prepared by thermal curing through hot pressing. In this case, the thermal curing was performed for 60 minutes under the conditions of a temperature of 160° C. and a pressure of 45 kgf/cm².

The prepared specimen was cut into 150 mm in width, 160 mm in length and 20 μm in thickness, and the dielectric constant at 1 GHz was measured by using an LCR meter (Keysight E5041C), and the results are shown in Tables 1 to 5 below.

In addition, the prepared specimen was cut into 40 mm in width, 40 mm in length and 20 μm in thickness, and the dielectric constant at 10 GHz was measured by using an LCR meter (Key sight E5041C), and the results are shown in Tables 1 to 5 below.

3. Peel Strength

Two sheets of FCCL (FLEXIBLE COPPER CLAD LAMINATION, HGLS-S211EM) in which an electrolytic copper foil (thickness: 1 oz), an adhesive (thickness: 10 μm) and a polyimide (PI) film (thickness: 25 μm) were sequentially laminated were prepared. After positioning two sheets of FCCL polyimide films to face each other, each of the thermosetting adhesive films prepared in Examples 1 to 15 and Comparative Examples 1 to 2 was positioned therebetween, and specimens were prepared by thermal curing through hot pressing. In this case, the thermal curing was performed for 60 minutes under the conditions of a temperature of 160° C. and a pressure of 45 kgf/cm².

The prepared specimen was cut into 150 mm in width and 150 mm in length, and peel strength was measured by peeling one sheet of FCCL under the conditions of a speed of 50 mm/min and a peeling direction of 90° (in terms of peel strength measurement, the initial value of 5 mm was excluded, and the average values after repeated measurement three times are shown in Tables 1 to 5 below.).

4. Moisture Absorption

According to the IPC-TM 650 test standard, the moisture absorption (%) of each of the thermosetting adhesive films prepared in Examples 1 to 15 and Comparative Examples 1 to 2 was measured.

Specifically, after each of the thermosetting adhesive films prepared in Examples 1 to 15 and Comparative Examples 1 to 2 was positioned between the first release film for hot press and the second release film for hot press, specimens were prepared by thermal curing through hot pressing. In this case, the thermal curing was performed for 60 minutes under the conditions of a temperature of 160° C. and a pressure of 45 kgf/cm².

The prepared specimen was cut into 50 mm in width, 50 mm in length and a 20 μm in thickness, and after drying the specimen at a temperature of 105° C. for 1 hour, the weight of the dried specimen was measured.

The dried specimen was immersed in distilled water at room temperature (23±1° C.) for 24 hours. After immersion, the moisture on the surface of the specimen was wiped with a dry cloth, and the weight of the specimen after moisture absorption was measured.

The moisture absorption was calculated through Relationship Formula 1 below, and the calculated values are shown in Tables 1 to 5 below.

Moisture absorption (%)=(Specimen after moisture absorption−Dried specimen)/Dried specimen× 100   [Relationship Formula 1]

5. Coefficient of Thermal Expansion

After each of the thermosetting adhesive films prepared through Examples 1 to 15 and Comparative Examples 1 to 2 was positioned between the first release film for hot press and the second release film for hot press, specimens were prepared by thermal curing through hot pressing. In this case, the thermal curing was performed for 60 minutes under the conditions of a temperature of 160° C. and a pressure of 45 kgf/cm². In addition, the prepared specimen was purged with nitrogen at 50 cc/min to prevent oxidation.

The prepared specimen was cut into 5 mm in width and 16 mm in length, and while raising the temperature from room temperature (23±1° C.) to 200° C. at a heating rate of 10° C./min by using the TMA Q 400 device, the thermal expansion coefficient ($F_1$) before reaching the glass transition temperature (Tg) of the specimen and the thermal expansion coefficient ($F_2$) after reaching the glass transition temperature (Tg) of the specimen were measured, respectively, and the results are shown in Tables 1 to 5 below.

6. Tensile Strength, Young's Modulus, Elongation

According to the IPC-TM 650 test standard, the tensile strength, Young's modulus and elongation of each of the thermosetting adhesive films prepared in Examples 1 to 15 and Comparative Examples 1 to 2 were measured.

Specifically, after each of the thermosetting adhesive films prepared in Examples 1 to 15 and Comparative Examples 1 to 2 was positioned between the first release film for hot press and the second release film for hot press, specimens were prepared by thermal curing through hot pressing. In this case, the thermal curing was performed for 60 minutes under the conditions of a temperature of 160° C. and a pressure of 45 kgf/cm².

The prepared specimen was cut into 100 mm in width, 100 mm in length and 20 μm in thickness, and the middle portion of the prepared specimen was punched out. The punched portion of the specimen by punching had a length of 20 mm and a thickness of 5 mm.

The tensile strength, Young's modulus and elongation at the time of setting the specimen with a span of 10 mm in the tensile tester, pulling the specimen at a speed of 50 mm/min and judging were calculated, and the results are shown in Tables 1 to 5 below.

7. Resin Flow

Specimens were prepared by contact bonding each of the thermosetting adhesive films prepared in Examples 1 to 15 and Comparative Examples 1 to 2 on one side of a polyimide (PI) film (thickness: 25 μm). In this case, contact bonding was performed at a temperature of 110° C. and a speed of 1.0 m/min. One side of the prepared specimen was punched out, and the thermosetting adhesive film of the specimen was laminated on the polyimide film of FCCL, and then thermally cured through hot pressing. In this case, the thermal curing was performed for 60 minutes under the conditions of a temperature of 160° C. and a pressure of 45 kgf/cm². A product (HGLS-S211EM) in which an lectrolytic copper foil (thickness: 1 oz), the adhesive (thickness: 10 μm) and the polyimide (PI) film (thickness: 25 μm) were sequentially laminated was used as the FCCL.

Thereafter, the resin flow (the length of the adhesive flowing out during the hot pressing process) of the punched out portion of the specimen was measured by using a microscope, and the results are shown in Tables 1 to 5 below.

8. Flame Retardancy

Two polyimide (PI) films (thickness: 25 μm) were prepared. After positioning two sheets of polyimide films to face each other, each of the thermosetting adhesive films prepared in Examples 1 to 15 and Comparative Examples 1 to 2 was placed therebetween, and specimens were prepared by thermal curing through hot pressing. In this case, the thermal curing was performed for 60 minutes under the conditions of a temperature of 160° C. and a pressure of 45 kgf/cm².

The prepared specimen was subjected to a flame retardancy test according to the UL94 flame retardant standard, and if the flame retardant standard was satisfied, it was evaluated as OK, and if the flame retardant standard was not satisfied, it was evaluated as NG, and the results are shown in Tables 1 to 5 below.

TABLE 1

| Classification | | Example 1 | Example 2 | Example 3 | Example 4 | Example 5 |
|---|---|---|---|---|---|---|
| Thermosetting acrylic rubber (parts by weight) | | 100 | 100 | 100 | 100 | 100 |
| Epoxy resin (parts by weight) | | 150 | 110 | 190 | 150 | 150 |
| Epoxy resin | Softening point (° C.) | 71 | 71 | 71 | 62 | 77 |
| | Epoxy equivalent weight (g/eq) | 270 | 270 | 270 | 285 | 291 |
| Phosphorous-based flame retardant (parts by weight) | | 20 | 20 | 20 | 20 | 20 |
| Curing agent (parts by weight) | | 13 | 13 | 13 | 13 | 13 |
| Inorganic filler (parts by weight) | | 30 | 30 | 30 | 30 | 30 |
| Insulation resistance (MΩ) | | 1,050 | 1,070 | 1,050 | 1,020 | 1,040 |

TABLE 1-continued

| Classification | | Example 1 | Example 2 | Example 3 | Example 4 | Example 5 |
|---|---|---|---|---|---|---|
| Permittivity | 1 GHz | 3.22 | 3.22 | 3.27 | 3.21 | 3.22 |
| | 10 GHz | 3.07 | 3.06 | 3.08 | 3.05 | 3.08 |
| Peel strength (kgf/cm) | | 1.95 | 1.99 | 1.88 | 1.20 | 1.32 |
| Moisture absorption (%) | | 0.26 | 0.25 | 0.26 | 0.29 | 0.26 |
| Coefficient of thermal expansion (ppm/° C.) | $F_1$ | 83 | 85 | 124 | 99 | 82 |
| | $F_2$ | 249 | 253 | 421 | 313 | 244 |
| Tensile strength (MPa) | | 28 | 21 | 28 | 22 | 29 |
| Young's Modulus (GPa) | | 0.67 | 0.38 | 0.69 | 0.55 | 0.68 |
| Elongation (%) | | 119.9 | 121.0 | 155.5 | 132.2 | 118.9 |
| Resin flow (μm) | | 66 | 65 | 89 | 71 | 20 |
| Flame retardancy (UL94 V-0) | | OK | OK | OK | OK | OK |

As can be seen in Table 1, it was confirmed that the thermosetting adhesive film prepared in Example 1 has excellent ion migration resistance, low permittivity at 1 GHz as well as 10 GHz, low moisture absorption, excellent mechanical properties and flame retardancy.

However, compared to the thermosetting adhesive film prepared in Example 1, it was confirmed that the thermosetting adhesive film prepared in Example 2 had lower Young's modulus as well as lower tensile strength.

In addition, compared to the thermosetting adhesive film prepared in Example 1, it was confirmed that the thermosetting adhesive film prepared in Example 3 had significantly increased elongation as well as a significantly increased thermal expansion coefficient.

In addition, compared to the thermosetting adhesive film prepared in Example 1, it was confirmed that the peel strength of the thermosetting adhesive film prepared in Example 4 was lowered, and the elongation rate as well as the thermal expansion coefficient was increased.

In addition, compared to the thermosetting adhesive film prepared in Example 1, it was confirmed that the resin flow as well as the peel strength of the thermosetting adhesive film prepared in Example 5 was reduced.

As can be seen in Table 2, it was confirmed that, compared to the thermosetting adhesive film prepared in Example 1, the thermosetting adhesive film prepared in Example 6 had lower peel strength as well as lower elongation and increased resin flow.

In addition, compared to the thermosetting adhesive film prepared in Example 1, the thermosetting adhesive film prepared in Example 7 not only had lowered insulation resistance, peel strength, elongation and resin flow, but also had increased moisture absorption and thermal expansion coefficient.

In addition, compared to the thermosetting adhesive film prepared in Example 1, it was confirmed that the peel strength of the thermosetting adhesive film prepared in Example 8 was lowered and the resin flow increased.

In addition, compared to the thermosetting adhesive film prepared in Example 1, the peel strength, tensile strength, Young's modulus and elongation of the thermosetting adhesive film prepared in Example 9 decreased, and the thermal expansion coefficient and resin flow increased.

TABLE 2

| Classification | | Example 6 | Example 7 | Example 8 | Example 9 |
|---|---|---|---|---|---|
| Epoxy resin | Softening point (° C.) | 52 | 85 | 71 | 71 |
| | Epoxy equivalent weight (g/eq) | 200 | 364 | 270 | 270 |
| Thermosetting acrylic rubber | Weight average molecular weight (Mw) | 850,000 | 850,000 | 830,000 | 350,000 |
| | Glass transition temperature (° C.) | 5.85 | 5.85 | 5.6 | 4.3 |
| | Acid value | 37.5 | 37.5 | 19.7 | 35.6 |
| | Viscosity (cps) | 5,000 | 5,000 | 4,900 | 2,100 |
| Insulation resistance (MΩ) | | 1,010 | 960 | 1,050 | 990 |
| Permittivity | 1 GHz | 3.24 | 3.19 | 3.15 | 3.25 |
| | 10 GHz | 3.10 | 3.04 | 3.02 | 3.08 |
| Peel strength (kgf/cm) | | 1.41 | 0.98 | 0.80 | 0.62 |
| Moisture absorption (%) | | 0.31 | 0.44 | 0.25 | 0.30 |
| Coefficient of thermal expansion (ppm/° C.) | $F_1$ | 88 | 103 | 85 | 120 |
| | $F_2$ | 271 | 320 | 250 | 342 |
| Tensile strength (MPa) | | 22 | 41 | 26 | 16 |
| Young's Modulus (GPa) | | 0.65 | 0.78 | 0.64 | 0.33 |
| Elongation (%) | | 71.0 | 66.0 | 115.4 | 39.2 |
| Resin flow (μm) | | 263 | 34 | 110 | 430 |
| Flame retardancy (UL94 V-0) | | OK | OK | OK | OK |

TABLE 3

| Classification | | Example 10 | Example 11 | Example 12 | Example 13 |
|---|---|---|---|---|---|
| Thermosetting acrylic rubber (parts by weight) | | 100 | 100 | 100 | 100 |
| Epoxy resin (parts by weight) | | 150 | 150 | 150 | 150 |
| Phosphorous-based flame retardant (parts by weight) | | 20 | 20 (phosphate-based flame retardant was used) | 5 (nitrogen-based melamine compound flame retardant was used) | 45 |
| Curing agent (parts by weight) | | 13 | 13 | 13 | 13 |
| Inorganic filler (parts by weight) | | 30 | 30 | 30 | 30 |
| Insulation resistance (MΩ) | | 1,050 | 970 | 1,090 | 88 |
| Permittivity | 1 GHz | 3.35 | 3.34 | 3.23 | 3.40 |
| | 10 GHz | 3.17 | 3.20 | 3.09 | 3.27 |
| Peel strength (kgf/cm) | | 2.07 | 0.84 | 2.01 | 0.72 |
| Moisture absorption (%) | | 0.25 | 0.26 | 0.24 | 0.31 |
| Coefficient of thermal expansion (ppm/° C.) | $F_1$ | 80 | 66 | 84 | 71 |
| | $F_2$ | 241 | 227 | 246 | 220 |
| Tensile strength (MPa) | | 28 | 30 | 31 | 30 |
| Young's Modulus (GPa) | | 0.68 | 0.66 | 0.69 | 0.67 |
| Elongation (%) | | 116.6 | 84.8 | 118.7 | 86.5 |
| Resin flow (μm) | | 66 | 45 | 65 | 62 |
| Flame retardancy (UL94 V-0) | | OK | NG | NG | OK |

As can be seen in Table 3, compared to the thermosetting adhesive film prepared in Example 1, it was confirmed that the thermosetting adhesive film prepared in Example 10 not only had an increased dielectric constant but also had increased moisture absorption.

In addition, compared to the thermosetting adhesive film prepared in Example 1, it was confirmed that the thermosetting adhesive film prepared in Example 11 not only had an increased dielectric constant but also reduced flame retardancy.

In addition, compared to the thermosetting adhesive film prepared in Example 1, it was confirmed that the flame retardancy of the thermosetting adhesive film prepared in Example 12 was lowered.

In addition, compared to the thermosetting adhesive film prepared in Example 1, it was confirmed that the thermosetting adhesive film prepared in Example 13 had lowered insulation resistance as well as lowered peel strength.

TABLE 4

| Classification | | | Comparative Example 1 | Comparative Example 2 |
|---|---|---|---|---|
| Thermosetting acrylic rubber | Weight average molecular weight (Mw) | | 830,000 | 790,000 |
| | Glass transition temperature (° C.) | | −16 | 20 |
| | Acid value | | 35.0 | 36.3 |
| | Viscosity (cps) | | 4,000 | 4,200 |
| | Insulation resistance (MΩ) | | 1,040 | 1,050 |
| Permittivity | | 1 GHz | 3.21 | 3.25 |
| | | 10 GHz | 3.05 | 3.10 |
| Peel strength (kgf/cm) | | | 1.99 | 0.26 |
| Moisture absorption (%) | | | 0.27 | 0.24 |
| Coefficient of thermal expansion (ppm/° C.) | $F_1$ | | 104 | 81 |
| | $F_2$ | | 291 | 237 |
| Tensile strength (MPa) | | | 19 | 40 |
| Young's Modulus (GPa) | | | 0.25 | 0.76 |
| Elongation (%) | | | 151.1 | 38.2 |
| Resin flow (μm) | | | 71 | 264 |
| Flame retardancy (UL94 V-0) | | | OK | OK |

As can be seen in Table 4, compared to the thermosetting adhesive film prepared in Example 1, the thermosetting adhesive film prepared in Comparative Example 1 not only had decreased tensile strength and Young's modulus, but also had an increased coefficient of thermal expansion and elongation.

In addition, compared to the thermosetting adhesive film prepared in Example 1, it was confirmed that the peel strength of the thermosetting adhesive film prepared in Comparative Example 2 was not only lowered, but also the resin flow increased.

TABLE 5

| Classification | | Example 1 | Example 14 | Example 15 |
|---|---|---|---|---|
| Thermosetting acrylic rubber | Weight average molecular weight (Mw) | 850,000 | 790,000 | 820,000 |
| | Glass transition temperature (Tg) | 5.85 | −8 | 13 |
| | Acid value | 37.5 | 36.2 | 37.1 |
| | Viscosity (cps) | 5,000 | 3,900 | 4,000 |
| Glass transition temperature of thermosetting adhesive film (Tg) | | 73 | 64 | 83 |
| Insulation resistance (MΩ) | | 1,050 | 1,050 | 1,050 |
| Permittivity | 1 GHz | 3.22 | 3.24 | 3.26 |
| | 10 GHz | 3.07 | 3.08 | 3.09 |
| Peel strength (kgf/cm) | | 1.95 | 1.93 | 0.43 |
| Moisture absorption (%) | | 0.26 | 0.26 | 0.24 |
| Coefficient of thermal expansion (ppm/° C.) | $F_1$ | 83 | 101 | 82 |
| | $F_2$ | 249 | 288 | 241 |
| Tensile strength (MPa) | | 28 | 18 | 38 |
| Young's Modulus (GPa) | | 0.67 | 0.24 | 0.73 |
| Elongation (%) | | 119.9 | 151.9 | 51.5 |
| Resin flow (μm) | | 66 | 70 | 250 |
| Flame retardancy (UL94 V-0) | | OK | OK | OK |

As can be seen in Table 5, compared to the thermosetting adhesive film prepared in Example 1, it was confirmed that the thermosetting adhesive film prepared in Example 14 not only had an increased coefficient of thermal expansion and elongation, but also had lowered tensile strength and Young's modulus.

In addition, it was confirmed that compared to the thermosetting adhesive film prepared in Example 1, the peel strength of the thermosetting adhesive film prepared in Example 15 was lowered.

Simple modifications or changes of the present invention may be easily performed by those skilled in the art, and all such modifications or changes may be considered to be included in the scope of the present invention.

The invention claimed is:

1. A thermosetting adhesive film, comprising:
an epoxy resin which is solid at a temperature of 15° C. to 28° C., a thermosetting acrylic rubber which is solid at a temperature of 15° C. to 28° C. and a phosphorus-based flame retardant,
wherein the thermosetting acrylic rubber comprises a hydroxy group and a carboxyl group as functional groups and has a weight average molecular weight (Mw) of 400,000 to 1,500,000 and a glass transition temperature (Tg) of −10° C. to 15° C.,
wherein the thermosetting adhesive film satisfies all of Conditions (1) to (3) and (5):

$$A > 100 \text{ M}\Omega \quad (1)$$

$$B_1 \leq 3.3, B_2 \leq 3.1 \quad (2)$$

$$C \geq 0.7 \text{ kgf/cm, and} \quad (3)$$

$$65° \text{ C.} \leq E \leq 85° \text{ C.,} \quad (5)$$

wherein in Condition (1) above, A represents the insulation resistance measured for 500 to 1,000 hours under the conditions of a temperature of 85° C., a relative humidity of 85% and a DC voltage of 50V according to the IPC-TM 650 test standard,
wherein in Condition (2) above, $B_1$ represents the dielectric constant at 1 GHz, and $B_2$ represents the dielectric constant at 10 GHz, and
wherein in Condition (3) above, C represents the peel strength measured at the time of peeling under the conditions of a speed of 50 mm/min and a peeling direction of 90°, and
wherein in Condition (5) above, E represents the glass transition temperature (Tg).

2. The thermosetting adhesive film of claim 1, wherein the thermosetting adhesive film further satisfies Conditions (4) and (6):

$$D \leq 0.5\%, \text{ and} \quad (4)$$

$$65 \text{ ppm/° C.} \leq F_1 \leq 95 \text{ ppm/° C.,} 200 \text{ ppm/° C.} \leq F_2 \leq 280 \text{ ppm/° C.,} \quad (6)$$

wherein in Condition (4) above, D represents the measured moisture absorption measured according to Relationship Formula 1 below according to the IPC TM-650 test standard, and
wherein in Condition (6) above, $F_1$ represents the coefficient of thermal expansion before reaching the glass transition temperature (Tg), when the temperature is raised at a rate of 10° C./min, and $F_2$ represents the coefficient of thermal expansion after reaching the glass transition temperature (Tg), when the temperature is raised at a rate of 10° C./min:

$$\text{Moisture absorption (\%)} = (D_1 - D_0)/D_0 \times 100 \quad \text{[Relationship Formula 1]}$$

wherein in Relationship Formula 1 above, $D_0$ represents the weight of a dried thermosetting adhesive film, and $D_1$ represents the weight after immersing a dried thermosetting adhesive in distilled water for 24 hours.

3. The thermosetting adhesive film of claim 1, wherein the thermosetting adhesive film further satisfies Conditions (7) to (9):

$$20 \text{ MPa} \leq G \leq 50 \text{ MPa} \quad (7)$$

$$0.3 \text{ GPa} \leq H \leq 1.0 \text{ GPa} \quad (8)$$

$$30\% \leq I \leq 130\% \quad (9)$$

wherein in Condition (7) above, G represents the tensile strength measured according to the IPC TM-650 test standard, wherein in Condition (8) above, H represents Young's Modulus measured according to the IPC TM-650 test standard, and wherein in Condition (9) above, I represents the elongation measured according to the IPC TM-650 test standard.

4. The thermosetting adhesive film of claim 1, wherein the epoxy resin comprises at least two selected from bisphenol-A type epoxy resin, O-cresol novolac type epoxy resin, phenol novolac type epoxy resin, low-chlorine type epoxy resin, dicyclopentadiene type epoxy resin, biphenyl type epoxy resin and multi-functional novolac type epoxy resin.

5. The thermosetting adhesive film of claim 1, wherein the epoxy resin has a softening point of 60 to 80° C. and an epoxy equivalent weight of 200 to 350 g/eq.

6. The thermosetting adhesive film of claim 1, wherein the thermosetting acrylic rubber is a polymer obtained by polymerization by including a monomer mixture comprising at least three selected from a butyl acrylate monomer, a 2-ethylhexyl acrylate monomer, a 2-methoxyethyl acrylate monomer, a 4-hydroxybuthyl acrylate monomer, an ethyl acrylate monomer, a 2-hydroxyethyl acrylate monomer, a 2-hydroxypropyl acrylate monomer, a pentylmethacrylate monomer, a 2-hydroxymethyl acrylate monomer, an ethylmethacrylate monomer, a methylmethacrylate monomer, an acrylic acid monomer and an acrylonitrile monomer.

7. The thermosetting adhesive film of claim 6, wherein the thermosetting acrylic rubber has an acid value of 30 to 45 and a viscosity of 500 to 8,000 cps.

8. The thermosetting adhesive film of claim 1, wherein the phosphorus-based flame retardant comprises at least one selected from a phosphate-based flame retardant, a phosphazene-based flame retardant and a phosphinate-based flame retardant.

9. The thermosetting adhesive film of claim 1, wherein the thermosetting adhesive film comprises 120 to 180 parts by weight of the epoxy resin and 10 to 40 parts by weight of the phosphorus-based flame retardant, based on 100 parts by weight of the thermosetting acrylic rubber.

10. The thermosetting adhesive film of claim 1, wherein the thermosetting adhesive film further comprises at least one selected from a curing agent and an inorganic filler.

11. The thermosetting adhesive film of claim 10, wherein the thermosetting adhesive film comprises 8 to 18 parts by weight of the curing agent and 20 to 40 parts by weight of the inorganic filler, based on 100 parts by weight of the thermosetting acrylic rubber.

12. The thermosetting adhesive film of claim 11, wherein the curing agent comprises at least one selected from an amine-based curing agent, an imidazole-based curing agent and an acid anhydride-based curing agent, and wherein the inorganic filler comprises at least one selected from aluminum hydroxide, magnesium hydroxide, silica, alumina, zinc oxide, magnesium oxide, zirconium oxide, titanium oxide, iron oxide, cobalt oxide and chromium oxide.

13. A coverlay film, comprising:

an electrically insulating substrate;

the thermosetting adhesive film of claim 1 which is formed on one surface of the electrically insulating substrate; and a release film which is formed on one surface of the thermosetting adhesive film.

* * * * *